United States Patent [19]

Shinohara et al.

[11] Patent Number: 4,998,159

[45] Date of Patent: Mar. 5, 1991

[54] CERAMIC LAMINATED CIRCUIT SUBSTRATE

[75] Inventors: Hiroichi Shinohara, Hitachi; Hideo Suzuki, Katsuta; Satoru Ogihara; Hideo Arakawa, both of Hitachi, all of Japan

[73] Assignee: Hitachi, Ltd., Tokyo, Japan

[21] Appl. No.: 362,924

[22] Filed: Jun. 8, 1989

[30] Foreign Application Priority Data

Jun. 10, 1988 [JP] Japan .................................. 63-143350

[51] Int. Cl.$^5$ .................... H01L 39/02; H01L 23/48; H01L 29/46; H01L 29/54
[52] U.S. Cl. ........................................ 357/80; 357/71; 357/65
[58] Field of Search ........................ 357/71, 80, 65; 361/397, 417

[56] References Cited

U.S. PATENT DOCUMENTS

| | | | |
|---|---|---|---|
| 4,256,792 | 3/1981 | Koepke et al. | 428/119 |
| 4,268,562 | 5/1981 | Bacon et al. | 428/113 |
| 4,322,778 | 3/1982 | Barbour et al. | 361/414 |
| 4,407,007 | 9/1983 | Desai et al. | 357/74 |
| 4,680,617 | 7/1987 | Ross | 357/72 |
| 4,783,695 | 11/1988 | Eichelberger et al. | 357/65 |
| 4,809,058 | 2/1989 | Funamoto et al. | 357/82 |

FOREIGN PATENT DOCUMENTS

| | | |
|---|---|---|
| 0211619 | 2/1987 | European Pat. Off. . |
| 0117250 | 9/1980 | Japan . |
| 2013650 | 8/1979 | United Kingdom . |

OTHER PUBLICATIONS

Chemical Abstracts, vol. 101, No. 24, Dec. 1984, p. 250, abstract No. 21545m, Columbus, Ohio, U.S. & JP-A-59 152 276 (Hitachi Shipbuilding and Engineering Co. Ltd.) 30-08-1984.

*Primary Examiner*—Rolf Hille
*Assistant Examiner*—D. Ostrowski
*Attorney, Agent, or Firm*—Antonelli, Terry, Stout & Kraus

[57] ABSTRACT

The present invention provides a ceramic laminated circuit substrate which is less in fluctuation of degree of shrinkage at firing and is less in voids and is suitable for formation of functional modules. This substrate comprises a conductor layer and a plurality of ceramic insulating layers wherein said ceramic insulating layers include at least one fiber-containing composite ceramic insulating layer. The present invention further provides a method for making this substrate which comprises preparing fiber-containing composite green sheets by adding to a green sheet raw material at least one of whiskers, glass filaments and chopped strands as fibers, laminating these fiber-containing composite green sheets in such direction that their casting directions are different together with green sheets containing no fibers to form a laminate and firing this laminate.

13 Claims, 4 Drawing Sheets

FIG. 4
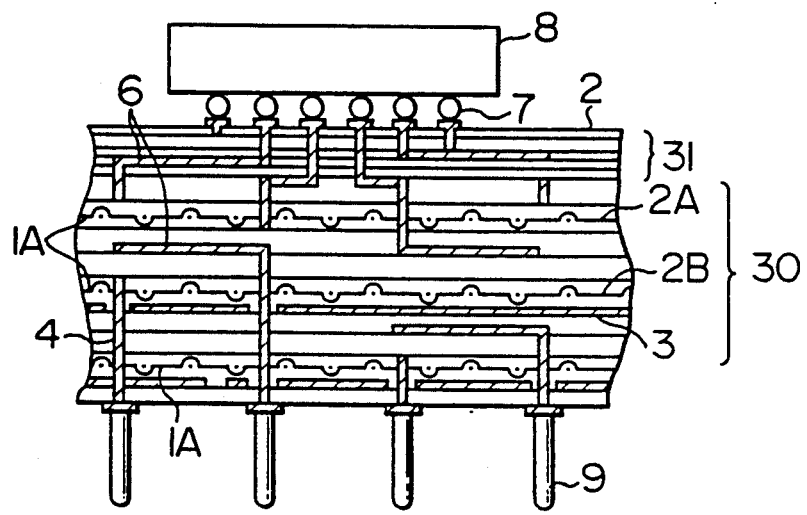
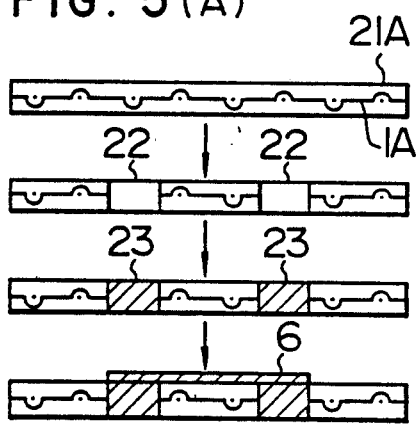
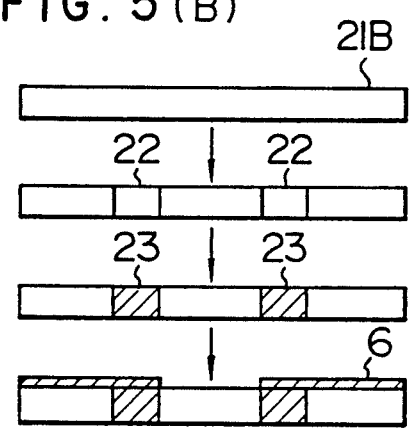
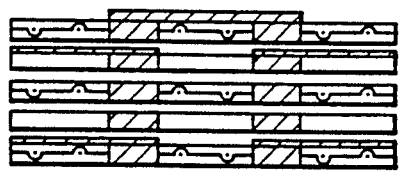
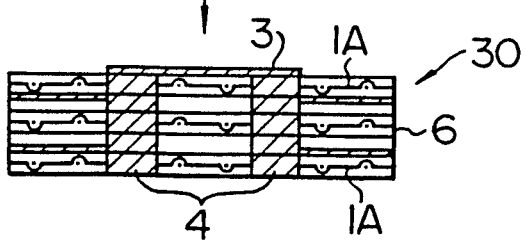

CERAMIC LAMINATED CIRCUIT SUBSTRATE

BACKGROUND OF THE INVENTION

1. Field of the Invention

The present invention relates to a ceramic laminated circuit substrate suitable for functional modules, a method for making the same and use of the substrate.

2. DESCRIPTION OF RELATED ART

Recently, high density integration has been demanded for increasing operation speed. For LSI chips, fine wiring has become possible owing to progress of wiring techniques and pitches of terminals for input and output of electric signal from LSI chips become fine, namely, less than 500 μm.

Further, with reference to integration, high density wiring has become possible by employing ceramic laminated circuit substrates. Connection of LSI chip and ceramic laminated circuit substrate is now carried out by mounting LSI chip directly or through the medium of a carrier substrate on ceramic laminated circuit substrate for high density integration.

However, in spite of the fact that LSI chips are becoming finer because of progress in technique, ceramic laminated circuit substrate is made by sintering to cause shrinkage of 10–30% and as a result there occurs the problem that connection between the LSI chip and the ceramic laminated circuit substrate cannot satisfactorily be attained due to uneven shrinkage. The unevenness or fluctuation in shrinkage occurs because degree of shrinkage is relatively high, namely, 10–30% and besides this degree of shrinkage cannot be accurately controlled. In general, fluctuation in shrinkage is closely connected with degree of shrinkage and with increase in degree of shrinkage, fluctuation increases.

In order to decrease fluctuation in degree of shrinkage, it is necessary to produce a molded product which is uniform and less in unevenness in density by controlling particle size of raw material powder and distribution of particle size or selecting dispersing method, binders and press conditions. However, even with such control of conditions, fluctuation in shrinkage at firing is at best about ±0.1–0.2% and this cannot cope with enhancement in density of wiring.

It is known to improve performances of ceramics by incorporating fibers into ceramics to form a composite ceramic. For example, it is known to improve toughness by incorporating fibers into ceramics. Furthermore, Japanese Patent Kokai (Laid-Open) No. 59-83985 discloses a lightweight and highly heat insulating ceramic substrate obtained by incorporating a foaming agent and fibers in glass. Moreover, Japanese Patent Kokoku (Publication) No. 51-16302 and Japanese Patent Kokai (Laid-Open) No. 55-117250 disclose conductors comprising a composite of carbon fibers and copper conductor. In addition, an organic multilayer circuit substrate is known which is mainly improved in strength and lowered in thermal expansion coefficient and which is prepared by incorporating glass cloth in an organic material. However, this is still not sufficiently low in the thermal expansion coefficient and has problem in reliability in connecting it to LSI chip. Furthermore, as disclosed in Japanese Patent Kokai (Laid-Open) No. 62-270442, composite ceramic materials are obtained by incorporating whiskers in a glass, but such materials cannot be sintered densely under atmospheric pressure and voids may remain in the products.

These composite ceramics are for improvement of toughness, strength and heat insulating properties and for lightening in weight and not for improvement of accuracy in size. For improvement of accuracy in size, Japanese Patent Kokai (Laid-Open) No. 62-241391 discloses that when a glass cloth comprising glass fibers is embedded in a green sheet for ceramic wiring substrates, generation of strain is inhibited owing to reinforcing action of the glass cloth and accuracy in size of each layer at lamination is improved.

The conventional ceramic laminated circuit substrates which are made by laminating and firing only the green sheets containing no fibers have the defects that degree of shrinkage at firing in the direction of laminate face is great and besides fluctuation thereof is great. When only the composite green sheets containing glass cloth are laminated and fired, since these green sheets shrink with difficulty in the direction of thickness, 15–30 vol% of voids are apt to be generated in the sheets.

SUMMARY OF THE INVENTION

The object of the present invention is to provide a ceramic laminated circuit substrate which is less in fluctuation in degree of shrinkage at firing and less in voids generated therein.

The ceramic laminated circuit substrate of the present invention for attaining the above object comprises a conductor layer and a plurality of ceramic insulating layers wherein said ceramic insulating layers include at least one fiber-containing composite green sheet.

The ceramic laminated circuit substrate is produced by preparing fiber-containing composite green sheets by adding at least one of whiskers, glass filaments and chopped strands as fibers to raw materials of green sheet, then laminating these green sheets so that they are positioned different in their casting direction together with green sheets containing no fibers, and then firing the laminate.

Fibers applicable to the fiber-containing composite ceramic insulating layer may be long or short fibers. The short fibers may be made of a single crystal such as whisker or of a polycrystal.

BRIEF DESCRIPTION OF THE DRAWINGS

FIG. 4 is a schematic sectional view of a ceramic laminated circuit substrate on which a thin film multi-layer wiring is formed.

FIG. 5 shows outline of production of a ceramic laminated circuit substrate using glass cloths.

DETAILED DESCRIPTION OF THE PREFERRED EMBODIMENTS

Figure 1:
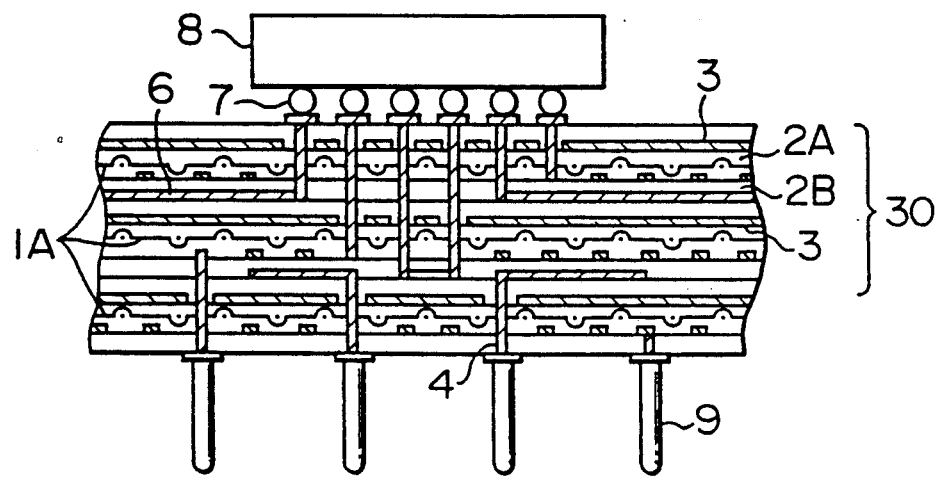
FIG. 1 is a schematic sectional view of a ceramic laminated circuit substrate made by using glass cloths.

It is effective that the fiber-containing composite ceramic insulating layers are laminated nearly symmetrically with respect to the centerplane of the thickness of the substrate or the lengthwise directions of fibers in adjacent laminated layers cross each other.

Furthermore, it is also effective that fiber-containing composite ceramic insulating layers in which fibers in the lengthwise direction cross each other are positioned at nearly the center in the direction of thickness of the substrate.

Furthermore, in the ceramic laminated circuit substrate comprising a conductor layer and a plurality of ceramic insulating layers of the present invention, the ceramic insulating layers include at least one fiber-containing composite ceramic insulating layer and void content of the ceramic laminated circuit substrate including said composite ceramic insulating layer is at most 10 vol%.

It is also effective that said conductor layer comprises Cu, Au, Ag, Ag-Pd, W or an alloy of two or more of them and the ceramic material of the ceramic insulating layer is one which is softened at lower than the melting point of said conductor layer.

It is preferred that softening point of said fibers is higher than the softening point of matrix of ceramic molded product before firing.

The substrate may have at least one of through-hole conductor and via-hole conductor.

It is more effective that degrees of shrinkage at firing of the ceramic laminated circuit substrate in the crossing two directions are at most 5%, respectively and fluctuation of the degree is at most 0.2%.

It is also further effective that degree of shrinkage of the fiber-containing composite ceramic insulating layer in the lengthwise direction of the fibers is at most 5% and fluctuation of the degree is at most 0.1%.

The fiber-containing composite ceramic circuit substrate may comprise fiber-containing composite ceramic insulating layers containing short fibers.

The ceramic circuit substrate for ceramic laminated circuit substrate comprises fiber-containing composite ceramic insulating layers containing short fibers.

Molded product for ceramic laminated circuit substrate is such that deformation amount of molded product containing fiber-containing composite green sheet in the lengthwise direction of the fibers against molding pressure is at most 1%.

The fiber-containing composite green sheet for the ceramic laminated circuit substrate comprises a green sheet in which are incorporated fibers.

The ceramic laminated circuit substrate with reinforcing sheet is made by bonding a molded product containing fiber-containing composite green sheet to a metal or ceramic and then firing the bonded product. It is preferred that the molded product contains a conductor layer.

The ceramic circuit substrate for light transmission is made by firing a molded product comprising at least one layer of green sheet containing optical fibers.

Further, ceramic circuit substrate is made by impregnating a glass cloth with molten glass.

Moreover, a thin film multi-layer wiring is formed on the ceramic laminated circuit substrate of the present invention.

The ceramic laminated circuit substrate of the present invention may contain a capacitor or a resistor.

Semiconductor module comprises the ceramic laminated circuit substrate of the present invention and a semiconductor device mounted thereon through CCB bonding.

The above-mentioned semiconductor module may be applied to a large electronic computer and the ceramic laminated circuit substrate containing a capacitor is applied as a carrier substrate for semiconductor.

A method for making the ceramic laminated circuit substrate of the present invention is as follows: At least one of whiskers, glass filaments and chopped strands are added to raw materials for green sheet to make fiber-containing composite green sheets, these green sheets are laminated in the direction different in their casting direction to make a laminate together with green sheets containing no fibers and this laminate is fired.

There is another method according to which at least one fiber-containing composite green sheet made by applying a slurry to a glass cloth is included in the laminate and the laminate is fired.

There are the following methods for making the fiber-containing composite green sheet: coating a slurry onto a glass cloth to incorporate fibers into green sheet; dipping a glass cloth in a slurry having adjusted viscosity; passing a glass cloth coated with a slurry through a slit of doctor blade; and coating both sides of a glass cloth with a slurry.

There is another method for making a ceramic laminated circuit substrate which comprises coating a liquid having a suitable viscosity and prepared by mixing an alkoxide, water and a catalyst on a green sheet to form a fibrous gel on the surface of the green sheet, laminating at least one green sheet thus obtained and firing the laminate.

In the thus constructed ceramic laminated circuit substrate, since the fibers contained in the ceramic insulating layer is small in shrinkage in the lengthwise direction at firing, shrinkage of the fiber-containing composite ceramic insulating layer in the lengthwise direction of the fibers can be prevented. By including at least one fiber-containing composite ceramic insulating layer, this insulating layer prevents shrinkage at firing of ceramic insulating layer free from fibers in the plane direction of laminate and thus prevents shrinkage of the ceramic laminated circuit substrate in the plane direction. Further, since the insulating layer free from fibers shrinks with ease at firing in the direction of thickness, the substrate shrinks in the direction of thickness to reduce void content in the substrate.

The above-mentioned fiber-containing composite ceramic insulating layers are laminated nearly symmetrically with respect to the centerplane of the thickness of the substrate, whereby nearly the same forces to prevent the shrinkage and deformation of the substrate at firing by the fiber-containing composite ceramic insulating layers are exerted above and below the centerplane of thickness of the substrate. Furthermore, the fiber-containing composite ceramic insulating layers laminated are arranged so that the lengthwise directions of fibers therein cross each other, whereby shrinkage in the plane direction of the substrate at firing can be prevented because the directions of preventing the shrinkage of this insulating layer cross each other.

Fibers which cross each other in the lengthwise direction in the layer shrink with difficulty in lengthwise direction of the fibers at firing and hence prevent shrinkage of the composite ceramic insulating layer containing such fibers in plane direction. Therefore, by laminating this fiber-containing composite insulating layers in nearly central position in the direction of thickness of substrate, shrinkage of both sides of substrate can be nearly equivalently prevented.

In ceramic laminated circuit substrate, fiber-containing composite ceramic insulating layer shrinks in the plane direction with difficulty and so has somewhat high void content of 15–30 vol%. On the other hand, ceramic insulating layer free from fibers shrinks with ease in the direction of thickness and so has a low void content of about 5 vol%. Therefore, void content of ceramic laminated circuit substrate containing at least one fiber-containing composite ceramic insulating layer is low as a whole, namely, 10 vol% or less. Reduction of strength of the substrate can be prevented by decrease of void content to 10 vol% or less. If void content is more than 10 vol%, strength of the substrate decreases and the substrate is difficult to put to practical use.

Good conductor layer can be formed by using Cu, Au, Ag, Ag-Pd, W, or alloys of two or more of them as a metal of the conductor layer which constitutes the ceramic laminated circuit substrate. Furthermore, shrinkage in the direction of thickness of ceramic insulating layer occurs with ease and besides adhesion between respective layers is improved if ceramic materials of ceramic insulating layer is softened at lower than the melting point of the metal of the conductor layer.

Moreover, when softening point of the fibers contained in the composite ceramic insulating layer is higher than the softening point of matrix of molded ceramic before firing, the fibers possess resistance against shrinkage in the lengthwise direction and in addition the matrix becomes easy to shrink in the direction of thickness to inhibit shrinkage of the fiber-containing composite ceramic insulating layer in the direction of plane.

Further, shrinkage of substrate in the direction of plane can be prevented when the substrate has at least one of through-hole conductor which pierces the substrate and via-hole conductor which does not pierce the substrate.

Besides, when degrees of shrinkage at firing in the two crossing directions on the surface of ceramic laminated circuit substrate are respectively 5% or less, fluctuation of degree of shrinkage is small and further, when the fluctuation is 0.2% or less, accuracy in positioning in fabrication of module is improved.

When degree of shrinkage at firing in the lengthwise direction of fibers of the fiber-containing composite ceramic insulating layer is 5% or less, dispersion of the degree of shrinkage is 0.1% or less and further, when the dispersion is 0.1% or less, accuracy in positioning in fabrication of module is improved.

When the ceramic circuit substrate comprises composite ceramic insulating layers containing short fibers, the insulating layers are less in shrinkage at firing in the lengthwise direction of the short fibers and dispersion of the degree of shrinkage is also small. Similarly, the ceramic circuit substrate for the ceramic laminated circuit substrate is less in shrinkage at firing and dispersion of degree of the shrinkage is also small.

For molded product for ceramic laminated circuit substrate, when it includes fiber-containing composite green sheet and undergoes deformation in lengthwise direction of 1% or less against molding pressure, deformation of printed pattern in the direction of plane of ceramic laminated circuit substrate becomes small. If the deformation exceeds 1%, deformation of printed pattern on the ceramic laminated circuit substrate is increased.

For fiber-containing composite green sheet for ceramic laminated circuit substrate, the fibers contained in the green sheet reduce deformation at molding and shrinkage at firing in the lengthwise direction of the fibers.

Next, in the case of ceramic laminated circuit substrate with reinforcing sheet, since shrinkage at firing of molded product containing fiber-containing composite green sheet is small in the lengthwise direction of the fibers, reliability in strength of the substrate can be increased by bonding this molded product to a metal or ceramic and firing it.

In addition, a conductor layer provided in said molded product constitutes a wiring and besides improves reliability of strength.

In the case of ceramic circuit substrate for light transmission, optical fibers contained in the green sheet prevents shrinking of green sheet at firing in the lengthwise direction of the optical fibers and thus shrinking of this substrate in the direction of plane can be prevented by forming a molded product comprising at least one green sheet mentioned above and firing this molded product.

When ceramic circuit substrate contains a glass cloth impregnated with glass, it can be prevented from shrinking at firing in the direction of plane of the glass cloth.

Furthermore, since the ceramic laminated circuit substrate of the present invention is decreased in shrinkage in the direction of plane of the substrate, a thin film multi-layer wiring can be formed in high accuracy on the substrate.

Shrinkage in the direction of plane at firing can also be decreased by containing a capacitor or a resistor in the ceramic laminated circuit substrate.

With reference to semiconductor module, since the ceramic laminated circuit substrate of the present invention is small in shrinkage in the direction of plane at firing, deviation in position of bonding to semiconductor device to be mounted thereon decreases. The semiconductor device and the substrate are soldered with higher accuracy through CCB bonding.

In the case of large electronic computer, it can exhibit sufficient performances by application of the semiconductor module made by bonding a semiconductor to the ceramic laminated circuit substrate of the present invention with high accuracy.

The large electronic computer can also exhibit sufficient performances by application of the ceramic laminated circuit substrate of the present invention containing a capacitor as a carrier substrate for the semiconductor device.

With reference to the method for making the ceramic laminated circuit substrate of the present invention, the lengthwise direction of the fibers contained in the composite green sheet becomes same as the casting direction of the green sheet. Therefore, the lengthwise direction of the fibers in one green sheet and that of the fibers in another green sheet can be made different by laminating these green sheets so that casting direction of them are different from each other. When the fiber-containing composite green sheet and the green sheet containing no fibers are laminated and this laminate is fired, the fiber-containing composite green sheet becomes difficult to shrink in the lengthwise direction of the fibers and so degree of shrinkage in this direction decreases and thus the ceramic laminated circuit substrate is prevented from shrinking in the direction of plane. Simultaneously, since the ceramics contained in the green sheet free from the fibers is softened, shrinking in the direction of thickness during firing becomes easy.

The fiber-containing composite green sheet made by coating a slurry onto a glass cloth is prevented from shrinking in the lengthwise direction of the fibers of the glass cloth at firing. Since at least one layer of this fiber-containing composite green sheet is contained in the laminate, this laminate is prevented from shrinking in the direction of plane during firing. On the other hand, the green sheet containing no fibers easily shrinks in the direction of thickness.

For making fiber-containing green sheet for ceramic laminated circuit substrate, it becomes easy to coat uniformly a slurry by any methods of coating the slurry onto a glass cloth; dipping a glass cloth in a slurry adjusted in viscosity; passing a glass cloth coated with a slurry through a slit of doctor blade; or coating a slurry on both sides of a glass cloth.

In making the ceramic laminated circuit substrate, an alkoxide, water and a catalyst are mixed to cause hydrolysis reaction of the alkoxide and water, which is accelerated or inhibited by the catalyst, resulting in a liquid of suitable viscosity. This viscous liquid is passed through fine pores and coated onto a green sheet to form a fibrous gel wherein the alkoxide is in the form of fibrils. Lamination is carried out using at least one layer of this green sheet and the resulting laminate is fired and as a result the green sheet is prevented from shrinking in the lengthwise direction of the fibers and besides the laminate is also prevented from shrinking in the lengthwise direction of the fibers.

The present invention will be further explained referring to FIGS. 1-11.

EXAMPLE 1

Fiber-containing composite ceramic multi-layer circuit substrate was produced in the following manner.

First, as shown in FIG. 5(A), a green sheet 21A in which fiber, namely, glass cloth 1A was incorporated was prepared. That is, 60% by weight of glass powders having an average particle size of 5 $\mu$m, 30% by weight of $\alpha$-quartz having an average particle size of 1 $\mu$m and 10% by weight of $SiO_2$ glass cloth were provided as ceramic raw materials. Composition of the glass powders was, in terms of oxide, 70-80% by weight of $SiO_2$, 10-20% by weight of $B_2O_3$, 1-5% by weight of an alkali metal oxide ($K_2O$ here) and 1% by weight or less of others. Thickness of the glass cloth was 50 $\mu$m. A slurry was prepared from powders comprising a mixture of the above glass powders and $\alpha$-quartz. The slurry was prepared by wet-mixing 100 parts by weight of the glass powders and $\alpha$-quartz mixed at the above ratio with 20 parts by weight of a methacrylic acid type binder, 99 parts by weight of trichloroethylene, 26 parts by weight of tetrachloroethylene, 35 parts by weight of n-butyl alcohol, and 1 part by weight of di-n-butyl phthalate in a ball mill for 24 hours. Then, this slurry was coated at uniform thickness on both sides of $SiO_2$ glass cloth 1A and thereafter, dried to make a fiber-containing composite green sheet 21A.

Separately, green sheet 21B was prepared by the conventional method from the above glass powders and $\alpha$-quartz as raw material powders. That is, a slurry was prepared by wet-mixing 100 parts by weight of raw material powders comprising 60% by weight of the glass powders and 40% by weight of $\alpha$-quartz with 20 parts by weight of a methacrylic acid type binder, 99 parts by weight of trichloroethylene, 26 parts by weight of tetrachloroethylene, 35 parts by weight of n-butyl alcohol and 1 part by weight of di-n-butyl phthalate in a ball mill for 24 hours. Then, this slurry was adjusted to a suitable viscosity by vacuum deaeration. This slurry was coated at a thickness of 0.5 mm on a silicone coated polyester film by a doctor blade and dried to obtain green sheet 21B.

Then, conductor paste 23 to be filled in via-hole was prepared by mixing 10-30% by weight of glass powders having an average particle size of 5 $\mu$m and 90-70% by weight of copper powders, adding to 100 parts by weight of this mixed powders 30 parts by weight of methacrylic acid type binder and 100 parts by weight of butylcarbitol acetate, kneading this mixture by a kneader and adjusting the paste to a suitable viscosity. Basic composition of the glass powders used in this paste was, in terms of metal oxide, 70-80 mol% of $SiO_2$, 10-15 mol% of $Al_2O_3$ and 10-15 mol% of $Cu_2O$ to make 100% in total.

Then, holes 22 of 100 $\mu$m in diameter were bored through the resulting fiber-containing composite green sheet 21A and green sheet 21B containing no fibers by machining and filled with conductor paste 23 to produce via-holes. Further, line wiring 6 and surface pattern conductor layer 3 were printed thereon with copper paste. The copper paste used for the line wiring was an ordinary copper paste comprising at least 95% by weight of copper based on the component excluding organic materials.

As shown in FIG. 5(C), totally 15 green sheets obtained above were laminated so that the three fiber-containing green-sheets are positioned in the vicinity of both the surfaces and in the middle of the laminate and the green sheets containing no fibers are positioned as the upper, lower and other layers. These layers were bonded by a hot press. Bonding conditions were temperature: 100° C. and pressure: 50 kgf/cm². Deformation due to the press bonding was a little, namely, less than 1%. The resulting laminate was heated at a rate of 100° C./h or less to remove the binder and fired at 950-1000° C. for 1 hour to obtain the fired product as shown in FIG. 5(D). The atmosphere for firing was nitrogen containing 10-50 vol% of water vapor. This atmosphere was employed because copper in the conductor paste is oxidized in the air. The thus obtained substrate is shown in FIG. 1. In this ceramic laminated circuit substrate 30, neither cracks nor peeling were seen in conductor layer 3 and around via-holes 4. Degrees of shrinkage of the ceramic laminated circuit substrate at firing were about 1% in the direction of plane and about 40% in the direction of thickness. Fluctuation of degree of shrinkage in the direction of plane was less than 0.1% for 100 samples (same in the following examples). Void content of the substrate was less than 10 vol% which was lower than 15-30% in conventional substrates. Furthermore, pins 9 were fitted to the fired product and semiconductor device 8, namely, LSI chip was mounted through CCB bond 7. No cracks were recognized in the vicinity of the portion where pin was fitted. Furthermore, neither warpage nor deformation were seen in the substrate 30. Furthermore, since fluctuation of the degree of shrinkage in the direction of plane was small, no electrical disconnection occurred between LSI chip 8 and substrate 30.

EXAMPLE 2

α-Quartz having an average particle size of 1 μm and glass powders having an average particle size of 5 μm and having the composition of 65-80% by weight of $SiO_2$, 10-30% by weight of $B_2O_3$, 5% by weight or less of an alkali metal oxide ($K_2O$), 1-7% by weight of $Al_2O_3$ and 1% by weight or less of others with the total being 100% were mixed at a mixing ratio of the glass powders: 90-40% by weight and α-quartz: 10-60% by weight. 100 parts by weight of the mixed powders were wet-mixed with 20 parts by weight of a methacrylic acid type binder, 99 parts by weight of trichloroethylene, 26 parts by weight of tetrachloroethylene, 35 parts by weight of n-butyl alcohol, and 1 part by weight of di-n-butyl phthalate in a ball mill for 24 hours to obtain a slurry. In the same manner as in Example 1, green sheet 21B was prepared as shown in FIG. 5(B) and then fiber-containing composite green sheet 21A was prepared. Chopped strands 1B made by cutting $SiO_2$ glass fibers to short length were used as the fibers. That is, in the same manner as above, a slurry was prepared from 90-40% by weight of the above glass powders, 10-60% by weight of α-quartz and 5-10% by weight of chopped strands 1B of $SiO_2$ glass (totally 100%) and green sheet was prepared therefrom in the same manner as in Example 1. Then, holes of 100 μm in diameter were bored through these fiber-containing composite green sheet 21A and green sheet 21B containing no fibers and were filled with the paste prepared in Example 1, namely, copper paste prepared from glass powders and copper powders comprising $SiO_2$, $Al_2O_3$ and $Cu_2O$. Furthermore, line wiring 6 and surface pattern conductor layer 3 were formed with copper paste in the same manner as in Example 1. In the fiber-containing composite green sheet 21A prepared in this example, the fibers are orientated in the casting direction, namely, in the direction of passing through slit of doctor blade and hence at laminating thereof, a pair of two green sheets which were shifted by 90° from each other in the lengthwise direction of the fibers were positioned as surface layer of multi-layer substrate and green sheets containing no fibers were positioned in the inner part. In this way, 20 layers were laminated. The laminate was further press bonded and fired at 900-1000° C. as in Example 1. Deformation in the plane direction after press bonding was small, namely, less than 1%.

Figure 2:
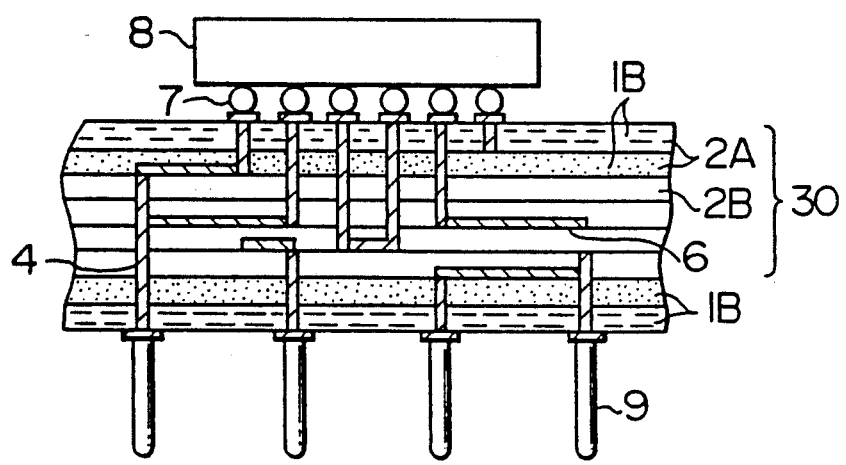
FIG. 2 is a schematic sectional view of a ceramic laminated circuit substrate made by using chopped strands.

The resulting substrate is shown in FIG. 2. Neither cracks nor peeling were seen around semiconductor layer 3 and via-holes 4 of this ceramic laminated circuit substrate 30. Degree of shrinkage at firing of this substrate was about 1-2% in the plane direction and about 40% in the direction of thickness. Dispersion of the degree of shrinkage in the plane direction was less than 0.1%. Furthermore, void content of the ceramic laminated circuit substrate was at most 10%. Pins 9 and LSI chip were fitted to the fired product. No cracks were seen around the portions where pins were connected. Besides, neither warpage nor deformation of the substrate were recognized. Moreover, because of less fluctuation of the degree of shrinkage in the plane direction, there occurred no electrical disconnection between LSI chip 8 and the substrate.

EXAMPLE 3

100 parts by weight of the powders obtained by mixing 60-70% by weight of the borosilicate glass powders used in Examples 1 and 2 and 30-40% by weight of $Al_2O_3$ powder having an average particle size of 1.5 μm were wet-mixed with 20 parts by weight of a methacrylic acid type binder, 99 parts by weight of trichloroethylene, 26 parts by weight of tetrachloroethylene, 35 parts by weight of n-butyl alcohol, and 1 part by weight of di-n-butyl phthalate in a ball mill for 24 hours to obtain a slurry. This slurry was divided into two parts and green sheets were prepared by conventional method from one of them. Another slurry was coated on both sides of $SiO_2$ glass cloths to make fiber-containing composite green sheets. Then, holes of 100 μm in diameter were made through the resulting fiber-containing composite green sheets and green sheets containing no fibers and filled with Ag-Pd paste to form via-holes. This Ag-Pd paste was a paste containing 5-30% by weight of Pd and at least 95% by weight of Ag+Pd excluding organic matters. Further, conductor layer and surface pattern were printed with said Ag-Pd paste on the green sheets. Pd in the Ag-Pd is an element which prevents Ag from migrating to the adjacent insulator to stabilize Ag.

In the same manner as in Example 1, the green sheets were laminated and press bonded to make a laminate. This laminate was heated at a rate of 100° C./h or less to remove the binder and fired at 900-950° C. for 1 hour. The firing was carried out in the air. Since Ag-Pd in the conductor paste is not oxidized with oxygen in the air, firing can be carried out in the air. Cracks or peeling were not recognized in the conductor layer and around via-holes in the substrate. Degree of shrinkage of the substrate at firing was about 1-2% in the direction of plane and about 40% in the direction of thickness. Fluctuation of degree of shrinkage in the plane direction was less than 0.1%. Void content of the substrate was at most 10 vol%. Then, pins and LSI chip were fitted to the fired product. No cracks were seen in the vicinity of the portions where pins were fitted. Neither warpage nor deformation were seen in the substrate. Because of less fluctuation of degree of shrinkage in the plane direction, no electrical disconnection occurred between the LSI chip and the substrate.

EXAMPLE 4

In the same manner as in Example 2, green sheets were made from mixed powders comprising 30-70% by weight of borosilicate glass powders used in Examples 1 and 2, 10-40% by weight of α-quartz or quartz glass and 10-40% by weight of $Al_2O_3$ (100% in total). Furthermore, in the same manner as in Example 2, fiber-containing composite green sheets were made from mixed powders comprising 30-70% by weight of borosilicate glass used in Examples 1 and 2, 10-40% by weight of α-quartz or $SiO_2$ glass, 5-30% by weight of $Al_2O_3$ and 5-20% by weight of $Al_2O_3$ whiskers (100% in total). The whiskers have sizes of about 0.5-1 μm in diameter and about 10-20 μm in length. Further, holes were made through these green sheets in the same manner as in Example 2 and were filled with Cu paste. Then, conductor layer, electric power source layer and surface pattern were printed with the Cu paste. At least 95% of this Cu paste excluding organic matters was Cu.

Lamination of the green sheets was carried out in the same manner as in Example 2 and the resulting laminate was fired at 950–1050° C. as in Example 1. The firing atmosphere was nitrogen containing water vapor. There were no cracks and occurred no peeling in the conductor layer and around the via-holes of the obtained ceramic laminated circuit substrate. Degree of shrinkage of the substrate at firing was about 1–2% in the plane direction and about 35–45% in the direction of thickness. Fluctuation of degree of shrinkage in the plane direction was less than 0.1%. Void content of the substrate was 10 vol% or less. Further, pins and LSI chip were fitted to the fired substrate. No cracks were seen in the vicinity of the portions where pins were fitted. There were neither warpage nor deformation in the substrate. No electrical disconnection occurred between the LSI chip and the substrate.

EXAMPLE 5

In the same manner as in Example 1, a slurry was prepared from mixed powders comprising 30–90% by weight of borosilicate glass used in Examples 1 and 2, 10–60% by weight of quartz glass, and 5–20% by weight of mullite (100% in total). This slurry was coated on both sides of a glass cloth as in Example 1 to make a fiber-containing composite green sheet. Then, holes were made through this sheet and filled with gold paste and a conductor layer was printed on the sheet with the gold paste. Then, lamination was effected as in Example 1 and the laminate was fired at 900–1050° C. The firing was effected in the air. Degree of shrinkage of the resulting ceramic laminated circuit substrate was about 0.5% in the direction of plane and about 35% in the direction of thickness. Neither warpage nor deformation occurred in the substrate. The substrate had a void content of 10 vol% or less. Then, pins and LSI chip were fitted to the fired substrate. Neither electrical disconnection of LSI chip and disconnection of pins occurred because fluctuation of degree of shrinkage in the plane direction was small.

EXAMPLE 6

Holes were made through the fiber-containing composite green sheet and the green sheets containing no fibers made in Example 3 and filled with a paste comprising Ag-Pd powders and glass powders. This paste contained 5–30% by weight of Pd based on Ag and 5–30% by weight of glass based on Ag+pd powders. The glass was glass powders comprising $Cu_2O$, $Al_2O_3$ and $SiO_2$ which were used in Example 1. Furthermore, as in Example 3, a conductor layer was printed with Ag-Pd powder paste and the green sheets were laminated and fired at 900–950° C. in the air. Cracks occur around via-holes. Reliability in the vicinity of via-holes was improved by using such paste. LSI chip and pins were fitted to the laminate. No electrical disconnection occurred in the obtained ceramic laminated circuit substrate.

EXAMPLE 7

In the same manner as in Example 1, green sheets were made from raw material powders obtained by mixing 40% by weight of α-quartz of 1 μm in average particle size and 60% by weight of glass powders of 5 μm in average particle size comprising, in terms of oxide, 15–25 mol% of MgO, 0.05–3 mol% of CaO, 20–35 mol% of $Al_2O_3$, 20–55 mol% of $B_2O_3$, 0–25 mol% of $SiO_2$, 0–5 mol% of an alkali metal oxide ($K_2O$), 0–5 mol% of ZnO and 0–20 mol% of PbO (100% in total).

Furthermore, 60% by weight of the above glass powders, 30% by weight of α-quartz and 10% by weight of $SiO_2$ glass cloth were provided at this ratio. A slurry was prepared from the glass powders and α-quartz as in Example 1 and was coated on both sides of the $SiO_2$ glass cloth to make a fiber-containing composite green sheet. Further, holes were made through the green sheet as in Example 1. The holes were filled with the conductor paste comprising Cu powders and glass powders comprising $Cu_2O$, $Al_2O_3$ and $SiO_2$ used in Example 1. Furthermore, a conductor layer, an electric power source layer and a surface pattern were printed with the Cu paste.

Then, in the same manner as in Example 1, the green sheets were laminated and press bonded to make a laminate. This laminate was fired as in Example 1. Neither cracks nor peeling occurred in the conductor layer and around via-holes of the resulting ceramic laminated circuit substrate. Furthermore, neither warpage nor deformation were seen in the substrate. Degree of shrinkage of the substrate at firing was about 1% in the direction of plane and about 40% in the direction of thickness. Fluctuation of degree of shrinkage in the plane direction was 0.1% or less. The substrate had a void content of 10 vol% or less. Pins and LSI chip were fitted to the fired substrate. No cracks were seen around the portions where pins were fitted. Further, fluctuation of the degree of shrinkage was small and so no electrical disconnection occurred between the LSI chip and the substrate.

EXAMPLE 8

100 parts by weight of a powder mixture comprising 70–80% by weight of mullite ($3Al_2O_3.2SiO_2$), 0.5–1.5% by weight of MgO, 1–3% by weight of $Al_2O_3$, and 20–30% by weight of $SiO_2$ (100% in total) was wet-mixed with 5–10 parts by weight of polyvinylbutyral, 60 parts by weight of trichloroethylene, 17 parts by weight of tetrachloroethylene, 23 parts by weight of n-butyl alcohol and 2 parts by weight of butylphthalylglycolate in a ball mill for 24 hours to obtain a slurry. In the same manner as in Example 3, this slurry was coated on both sides of an $SiO_2$ glass cloth to make a fiber-containing composite green sheet. Then, using the above slurry, a green sheet containing no fibers by ordinary doctor blade method. Further, holes were made through the green sheet containing no fibers and filled with W paste in the same manner as in Example 1. Then, a conductor layer, an electric power source layer and a surface pattern were printed on the green sheet with the W paste. The W paste was a conventional paste containing at least 95% by weight of W based on the component excluding organic matters. As in Example 1, the resulting green sheets were laminated and press bonded to make a laminate. This laminate was fired at 1600°–1650° C. for 1 hour. The firing atmosphere was nitrogen containing 10–20 vol% of $H_2$ gas and 10–20 vol% of $H_2O$. $H_2$ gas was added to prevent oxidation of W. The resulting ceramic laminated circuit substrate had neither cracks nor peeling in line wiring and around via-holes. Further, neither warpage nor deformation were seen in the substrate. Degree of shrinkage at firing of the substrate was about 1% in the direction of plane and about 40% in the direction of thickness. Fluctuation of the degree of shrinkage in the plane direction was at most 0.1%. The substrate had a void content of 10 vol% or less. Pins and LSI chip were attached thereto. No cracks were observed around the portions where pins were attached. Further, no electrical disconnection occurred between the substrate and the LSI chip because fluctuation of the degree of shrinkage in the plane direction was small. between the substrate and pins and between the LSI chip and the substrate.

TABLE 1

| Materials for ceramics insulating layer (wt %) | Kind of fiber | Amount of fiber (wt %) | Firing condition (atmosphere) |
| --- | --- | --- | --- |
| $Li_2O$—$K_2O$—$Al_2O_3$—$SiO_2$—$CaF_2$ (10–13)(2–3)(5–15)(70–80)(1–2) | $SiO_2$ glass cloth | 5–10 | 950–1000° C. (air) |
| MgO—$Al_2O_3$—$SiO_2$ (10–25)(20–40)(40–60) | $Al_2O_3$ whisker | 5–10 | 950–1000° C. ($N_2$ + $H_2O$) |
| ZnO—MgO—$Al_2O_3$—$SiO_2$-others (1–5)(10–20)(20–30)(45–65)(0–5) | $SiO_2$ glass cloth | 5–10 | 900–1000° C. (air) |
| PbO—$Al_2O_3$—$B_2O_3$—$SiO_2$-others (1–30)(5–70)(1–30)(1–50)(0–10) | $Al_2O_3$ whisker | 10–20 | 900–1000° C. (air) |
| Alkali metal oxide-$B_2O_3$—$SiO_2$—ZnO (1–5)(10–20)(70–80)(0.1–0.5) | $ZrO_2$ fiber | 10–20 | 900–950° C. (air) |
| Mullite ($3Al_2O_3.2SiO_2$)—MgO—$Al_2O_3$-$SiO_2$ (70–80)(0.5–1.5)(1–3)(20–30) | Mullite fiber | 5–10 | 1600–1650° C. (air) |
| | $Al_2O_3$ whisker | 5–10 | 1600–1650° C. ($N_2$ + $H_2$ + $H_2O$) |
| Mullite-$SiO_2$-rare earth element oxide (70–99.9)(0–29.9)(0.1–3) | $SiO_2$ glass filament | 10–20 | 1600–1650° C. ($N_2$ + $H_2$ + $H_2O$) |
| AlN—$Y_2O_3$ (97–99)(3–1) | AlN fiber | 5–10 | 1800–1900° C. ($N_2$/hot press) |
| | $Y_2O_3$ fiber | 1–5 | 1800–1900° C. ($N_2$/hot press) |
| | BN fiber | 5–10 | 1800–1900° C. ($N_2$/hot press) |

| Materials for ceramics insulating layer (wt %) | Conductor | Degree of shrinkage at firing (%) | |
| --- | --- | --- | --- |
| | | Plane direction | Direction of thickness |
| $Li_2O$—$K_2O$—$Al_2O_3$—$SiO_2$—$CaF_2$ (10–13)(2–3)(5–15)(70–80)(1–2) | Au | 1–3 | 35–45 |
| MgO—$Al_2O_3$—$SiO_2$ (10–25)(20–40)(40–60) | Cu | 0.5–1 | 25–35 |
| ZnO—MgO—$Al_2O_3$—$SiO_2$-others (1–5)(10–20)(20–30)(45–65)(0–5) | Ag—Pd | 1–2 | 30–40 |
| PbO—$Al_2O_3$—$B_2O_3$—$SiO_2$-others (1–30)(5–70)(1–30)(1–50)(0–10) | Ag—Pd | 1–3 | 35–45 |
| Alkali metal oxide-$B_2O_3$—$SiO_2$—ZnO (1–5)(10–20)(70–80)(0.1–0.5) | Ag | 1–2 | 30–40 |
| Mullite ($3Al_2O_3.2SiO_2$)—MgO—$Al_2O_3$-$SiO_2$ (70–80)(0.5–1.5)(1–3)(20–30) | W | 1–2 | 30–40 |
| | W | 1–2 | 30–40 |
| Mullite-$SiO_2$-rare earth element oxide (70–99.9)(0–29.9)(0.1–3) | W | 2–3 | 35–40 |
| AlN—$Y_2O_3$ (97–99)(3–1) | W | 0.5–1 | 30–40 |
| | W | 1–5 | 30–40 |
| | W | 0.5–1 | 30–40 |

EXAMPLE 9

In the same manner as in Examples 1 and 2, fiber-containing composite green sheets were made using the ceramics shown in Table 1. Size of fibers was as follows: diameter: 0.5–1 μm and length: 10–20 μm for whiskers and diameter: 10–30 μm and length 50–1000 μm for glass filaments. Separately, green sheets containing no fibers were made using the same materials. Furthermore, holes were made through these green sheets in the same manner as in Example 1 and were filled with the conductor paste shown in Table 1 and then, conductor layer was printed. Furthermore, the green sheets were laminated to make a laminate and the laminate was fired. Cracks and peeling did not occur in the conductor layer and around the via-holes of the resulting ceramic laminated circuit substrate. Further, neither warpage nor deformation were seen in the substrate. The substrate had a void content of 10 vol% or less. Then, pins and LSI chip were attached thereto. Degree of shrinkage in the plane direction at firing of the substrate was small and fluctuation of the degree of shrinkage was 0.1% or less. Electrical disconnection did not occur

EXAMPLE 10

Suitable amounts of ethyl silicate $Si(OC_2H_5)_4$, $H_2O$, HCl and $C_2H_5$ OH were mixed and left to stand. When the mixture had a viscosity at which the mixture can be spun, the mixture was coated in the form of fiber on the green sheet made in Examples 1–9. Then, in the same manner as in Examples 1–9, holes were made through the green sheet and filled with conductor paste and further the conductor layer and others were printed thereon with the conductor paste. These green sheets were laminated and the laminate was fired to obtain a ceramic laminated circuit substrate. Neither cracks nor peeling occurred in the conductor layer and around the via-holes. Moreover, neither warpage nor deformation of the substrate occurred. The substrate had a void content of 10 vol% or less. Then, pins and LSI chip were attached thereto. The fibrous gel became $SiO_2$ glass fibers during firing, which reduced the degree of shrinkage in the plane direction. Since fluctuation of the degree of shrinkage in the plane direction was less than 0.1%, no electrical disconnection occurred between the pins and the substrate and the LSI chip and the substrate.

EXAMPLE 11

Figure 3:
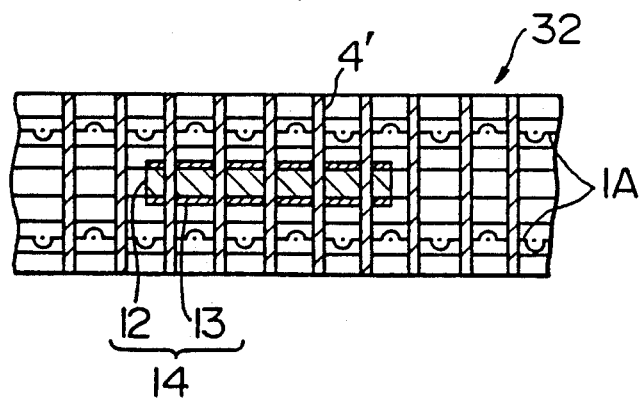
FIG. 3 is a schematic sectional view of a ceramic laminated circuit substrate which contains a capacitor.

Ceramic laminated circuit substrate containing a capacitor which was made in this example is shown in FIG. 3. A green sheet containing no fibers was made using the ceramic materials used in Examples 1-7 and 9 which can be sintered at 1000° C. or lower. Holes were made through the green sheet and were filled with Ag-Pd paste. Electrode layer 13 was printed thereon with the Ag-Pd paste and a layer was printed with a paste prepared from dielectric ceramic powders. The Ag-Pd paste was embedded in this dielectric layer 12 and an electrode layer 13 was printed. This green sheet was sandwiched between green sheets of an insulating material filled with Ag-Pd paste. The dielectric material 12 was of Pb(Mg 1/3 Nb 2/3)O$_3$-PbTiO$_3$ system. Next, fiber-containing composite green sheet was made using the ceramic insulating materials used in Examples 1-7 and 9 which can be sintered at 1000° C. or lower. Holes were made through this green sheet or the green sheet coated with ceramics in the form of fibers in Example 10 and the holes were filled with Ag-Pd paste. Green sheet containing dielectric material was positioned inner part and the fiber-containing composite green sheets were positioned near the surface and these were laminated and the laminate was fired in the air. Through-holes 4' are formed with Ag-Pd paste within the ceramic laminated substrate containing a capacitor. Warpage and deformation of the substrate 32 did not occur. This ceramic laminated circuit substrate 32 containing a capacitor 14 had a void content of 10 vol% or less. Since fluctuation of degree of shrinkage in the plane direction was small, this substrate 32 can be connected with other parts in high accuracy.

EXAMPLE 12

Outline of this example is shown in FIG. 4. A thin film multi-layer wiring 31 comprising an insulating material 2 of polyimide and a conductor layer of Cu was formed on the ceramic laminated circuit substrate made in Examples 1-10. Since conventional ceramic laminated circuit substrate exhibited great fluctuation of degree in the shrinkage at firing in the plane direction, there is the problem that electrical connection cannot be satisfactorily attained between the substrate 30 and thin film multi-layer wiring 31. On the other hand, since the substrate of the present invention shows less fluctuation in the degree of shrinkage in the plane direction, no electrical disconnection occurred between the substrate and the thin film multilayer wiring 31.

EXAMPLE 13

On the ceramic laminated circuit substrates made in Examples 3, 5 and 6 were coated a mixture of the same powders as the ceramic insulating material of these substrates and a photosensitive resin and holes were made through these substrates by photolithography and were filled with an Ag-Pd paste. Examples of the photosensitive resin include methacrylic acid type (e.g., polymethyl methacrylate), acrylic acid type, ammonium bichromate+resin, and organo-silicone type. Amount of this photosensitive resin added is suitably 10-30% by weight of the powders. A mixture of Ag-Pd powders and the photosensitive resin was further coated thereon and a conductor pattern was formed by photolithography. This procedure was repeated several times to produce multi-layers. This was fired at 900°-950° C. The firing atmosphere was air. The resulting ceramic laminated circuit substrate on which an inorganic thin film multi-layer wiring exhibited formed was small fluctuation in the degree of shrinkage in the plane direction at firing and hence no electrical disconnection occurred. Next, in the same manner as above, an inorganic thin film multilayer wiring was formed using Cu in place of Ag-Pd. Firing atmosphere was nitrogen containing water vapor.

EXAMPLE 14

On the fiber-containing composite green sheets and the green sheets containing no fibers made in Example 1-9 was coated a mixture of a photosensitive resin and conductor powders capable of being sintered simultaneously with ceramic insulating material and a conductor pattern of 100 μm or less in width was formed by lithography. These green sheets were laminated in the same manner as in Examples 1-9 and the resulting laminate was fired to obtain a ceramic laminated circuit substrate. Then, pins and LSI chip were attached thereto. Since fluctuation in the degree of shrinkage in the plane direction at firing was small, there occurred no electrical disconnection with pins and LSI chip. When the LSI chip and the substrate are connected, width of wiring, etc. are designed so that electrical connection can be attained, under taking into consideration fluctuation in the degree of shrinkage. However, in the case of conventional ceramic laminated circuit substrate, degree of shrinkage in the plane direction at firing is relatively high and there is a limitation in making the wiring finer. On the other hand, since the substrate of the present invention exhibited small fluctuation in the degree of shrinkage in the plane direction, electrical disconnection did not occur when fine wiring was formed.

EXAMPLE 15

Figure 7:
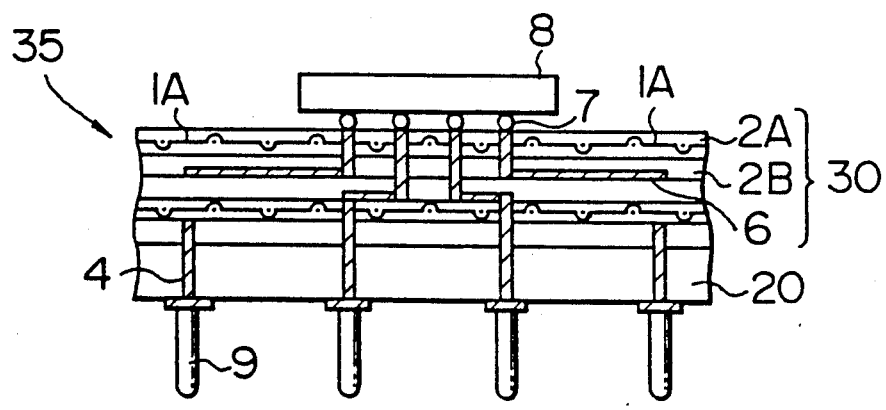
FIGS. 7 and 8 are schematic sectional views of ceramic laminated circuit substrates with a reinforcing sheet.

Schematic view of the ceramic laminated circuit substrate with reinforcing sheet is shown in FIG. 7. Holes were made through the fired Al$_2$O$_3$ substrate 20 by means of laser or the like and the holes were plated. Then, the laminate of green sheets including fiber-containing composite green sheets which was made in Examples 1-14 was bonded to the above substrate 20 and fired at a proper firing temperature. Further, pins 9 for inputting and outputting electric signal were brazed thereto and then LSI chip 8 was attached thereto. In the resulting ceramic laminated circuit substrate 35 having reinforcing sheet, there occurred no electrical disconnection between the LSI chip 8 and the substrate. Furthermore, since the strength of the portion of ceramics provided with pin 9 was high, reliability of the portions provided with pins was also enhanced. As in this example, the laminate of green sheets including fiber-containing composite green sheets shows substantially no shrinkage and hence bonding to sintered ceramics and firing of the green sheet laminate can be carried out at the same time.

EXAMPLE 16

Figure 6:
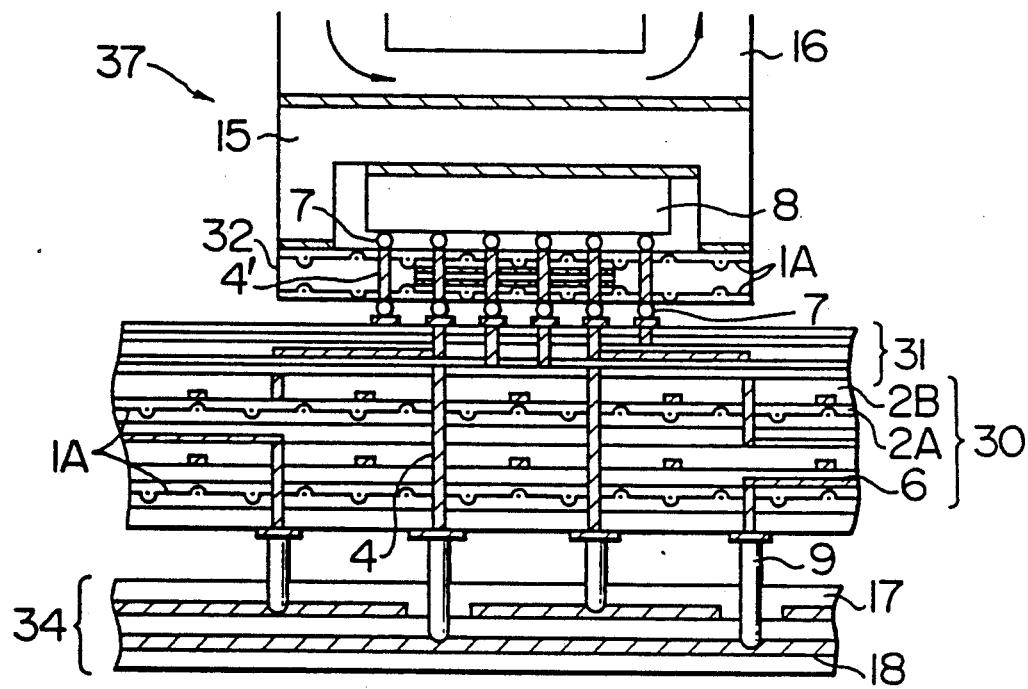
FIG. 6 is a schematic sectional view of a semiconductor module comprising a ceramic laminated circuit substrate on which a thin film multi-layer wiring is formed and a ceramic laminated circuit substrate containing a capacitor which is applied onto said ceramic laminated circuit substrate.

Schematic view of the semiconductor module made in this example is shown in FIG. 6. The capacitor-containing ceramic laminated circuit substrate 32 made in Example 11 was mounted as a carrier substrate on the ceramic laminated circuit substrate made in Examples 12-13 and additionally LSI chip 8 was mounted on the carrier substrate 32. Furthermore, AlN cap 15 was put on the carrier substrate and the ceramic laminated circuit substrate 30 was connected with electric power source substrate 34 and cooling system 16 which removes the heat generated at LSI chip to make module 37 for large-sized electronic computer. The electric power source 34 comprising an organic print plate 17 as insulator and copper layer 18 as conductor was applied.

EXAMPLE 17

Figure 8:
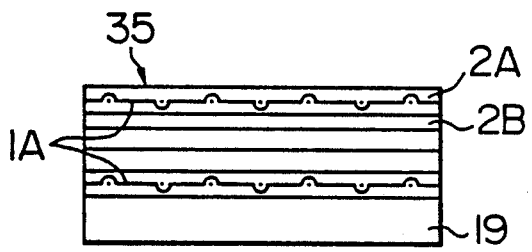
Figure 9:
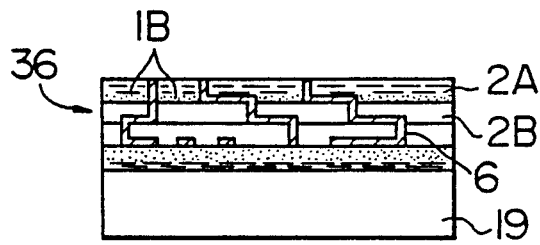
FIGS. 9 and 10 are schematic sectional views of multi-layer metal-core ceramic substrates.
Figure 10:
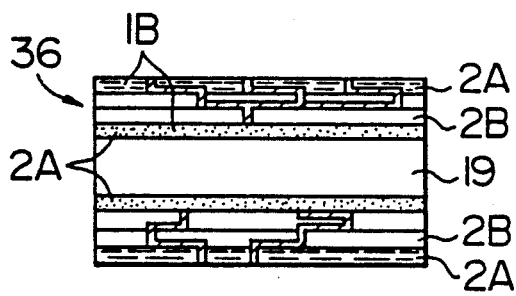

A laminate obtained by laminating fiber-containing composite green sheets and green sheets containing no fibers made in Examples 1-10 was bonded to a metal sheet having a melting point higher than the sintering temperature of the laminate. This was fired to obtain a ceramic laminated circuit substrate 35 having a reinforcing sheet as shown in FIG. 8. The green sheet laminate including fiber-containing composite green sheets as of this example undergoes substantially no shrink by firing and so bonding to metal and firing of the green sheet laminate can be effected at the same time. Application examples of this substrate 35 include the fiber-containing multi-layer metal core ceramic substrate 36 as shown in FIGS. 9 and 10.

In this substrate 36, metal 19 is provided with mechanical strength, heat-diffusibility and electromagnetism shielding properties and ceramics are provided with electric characteristics. Hitherto, multi-layers are formed by carrying out repeated printing and firing on the metal, but if failures occur during formation of the multi-layers, the substrate per se becomes defective and so production yield is low and further evenness of the substrate becomes inferior with increase in the number of layers. Thus, the number of layers is at most several layers.

In the case of the fiber-containing multi-layer metal core ceramic substrate 36, fiber-containing composite green sheets and green sheets containing no fibers were molded and laminated including conductor layers therein and firing of this laminate and bonding of metal were carried out at the same time, thereby to form a substrate comprising laminates of fiber-containing composite ceramic insulating layers 2A and fiber-free ceramic insulating layers 2B which were bonded to metal 19 and which contained conductor layer therein. Thus, production yield was high and multi-layers comprising several ten layers were able to be produced. Iron, aluminum-plated steel, stainless steel, copper, titanium and the like can be used for metal 19.

EXAMPLE 18

Figure 11:
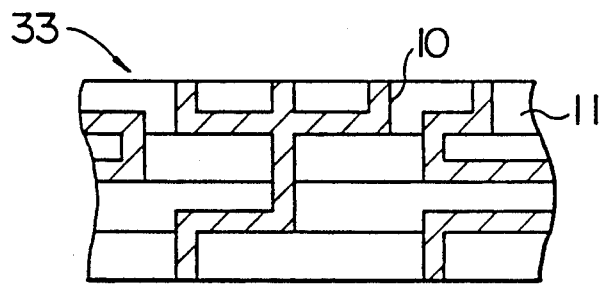
FIG. 11 is a schematic sectional view of ceramic circuit substrate for light transmission.

Schematic view of a ceramic circuit substrate for light transmission of this example is shown in FIG. 11. Optical fibers 10 mainly composed of quartz glass were incorporated into a slurry of borosilicate glass mainly composed of $B_2O_3$ and $SiO_2$ and this was fired at 900°-950° C. to make substrate 33. Substantially no shrinkage occurred in the direction of fibers 10. Then, holes were made through a green sheet made of borosilicate glass and quartz glass and filled with optical fibers and optical fibers were placed on this green sheet. Multi-layer was formed from the green sheets to make a laminate and this laminate was fired at 900°-1000° C. The borosilicate glass 11 was softened by the firing to bond the layers. Thus, laminated circuit substrate 33 for light transmission having transmission system of fibers 10 for light signal can be obtained in this example.

The present invention has the following effects owing to the above-mentioned construction of the present invention.

Since the ceramic laminated circuit substrate contains at least one fiber-containing composite ceramic insulating layer, shrinkage of the substrate in the plane direction at firing is prevented and so shrinkage in that direction decreased and fluctuation of shrinkage in that direction decreases. Accuracy in position of bonding of semiconductor device is improved and bonding can be securely attained. Furthermore, since ceramic insulating layers containing no fibers shrink with ease in the direction of thickness, void content in the substrate decreases to improve strength.

The fiber-containing composite ceramic insulating layers are laminated nearly symmetrically with respect to the center plane of the thickness and hence shrinkage at firing balances between both sides of the substrate. Further, the lengthwise direction of fibers in one layer and that of fibers in adjacent layer cross each other and shrinkage in the plane direction of the substrate at firing decreases. Therefore, fluctuation of shrinkage in the plane direction decreases and thus bonding property to semiconductor device is improved and besides void content in the substrate decreases to improve strength. Furthermore, when fiber-containing composite ceramic insulating layer containing fibers which cross each other in the lengthwise direction thereof are positioned in nearly the center portion in the direction of thickness of the laminate, the above-mentioned effects are also obtained. Further, strength of the substrate can be maintained when the ceramic laminated circuit substrate comprising conductor layers and a plurality of ceramic insulating layers contains at least one fiber-containing composite ceramic insulating layer and has a void content of 10 vol% or less. Therefore, the substrate can be put to practical use as a carrier substrate carrying a semiconductor device.

When the conductor layer comprises Cu, Au, Ag, Ag-Pd, W, or an alloy of two or more of them, a superior conductor layer can be formed and as a result the wiring is superior. Further, when the ceramic materials of the ceramic insulating layers are softened at a temperature lower than the melting point of the conductor layers, the ceramic insulating layers become easy to shrink in the direction of thickness and besides adhesion between respective layers is improved and hence shrink of the substrate in the plane direction is small and void content is also small.

Moreover, when softening temperature of the fibers is higher than that of matrix of ceramic molded product before firing, shrinking of the fiber-containing composite ceramic insulating layers in the plane direction is inhibited and so shrinkage of the substrate in the plane direction at firing decreases. The substrate which contains at least one of through-hole conductor and via-hole conductor also decreases in shrink in the plane direction at firing.

Furthermore, when degrees of shrinkage in the two crossing directions on the face of the substrate are 5% or less, respectively and fluctuation of the degree of shrinkage is 0.2% or less, accuracy in positioning in fabrication of a module is high and so bonding to semiconductor device mounted on the substrate is improved. When the degree of shrinkage of the fiber-containing composite ceramic insulating layers in the lengthwise direction of the fibers at firing is 5% or less and fluctuation of the degree is 0.1% or less, shrinkage of the substrate in the plane direction at firing is decreased and fluctuation thereof is also decreased.

Fiber-containing composite ceramic insulating layers which contain short fibers are small in shrinkage in the lengthwise direction of the short fibers at firing and are less in fluctuation thereof and so can be used as ceramic circuit substrate and as ceramic circuit substrate for ceramic laminated circuit substrate.

In the laminate containing fiber-containing composite green sheet, when deformation of molded product in the lengthwise direction of the fibers against the pressure applied for molding is 1% or less, deformation of printed pattern in the plane direction of the substrate is decreased and so the laminate can be used as a molded product for ceramic laminated circuit substrate.

Further, the fiber-containing composite green sheet is small in shrinkage at firing in the lengthwise direction of the fibers and can be used as fiber-containing composite green sheet for ceramic laminated circuit substrate.

When a molded product containing fiber-containing composite green sheet and a metal or ceramic are bonded to each other and fired, reliability of strength increases and so a ceramic laminated circuit substrate with a reinforcing sheet comprising many layers can be easily produced. Furthermore, if the molded product contains conductor layers, good wiring can be formed and the above advantages can also be obtained.

When a molded product comprising at least one green sheet containing optical fibers is fired, shrinkage at firing of this green sheet in the lengthwise direction of the optical fibers decreases and hence a ceramic circuit substrate for light transmission less in shrinkage of the substrate in the plane direction at firing can be produced.

Moreover, a ceramic circuit substrate less in shrinkage at firing in the plane direction can be made by impregnating a glass cloth with molten glass and then molding the glass cloth.

Since the ceramic laminated circuit substrate of the present invention is less in shrinkage at firing in the plane direction, a thin film multi-layer wiring can be formed on the substrate with high accuracy. Therefore, fluctuation of shrinkage is small and accuracy in the position of bonding a semiconductor device is improved.

When the ceramic laminated circuit substrate of the present invention contains a capacitor or a resistor, shrinkage of the substrate in the plane direction at firing decreases and hence accuracy in position for bonding of a semiconductor device is improved as mentioned above.

Since the ceramic laminated circuit substrate of the present invention is small in shrinkage in the plane direction at firing and is superior in accuracy in position for bonding of semiconductor device, a semiconductor module having secure bonding between the substrate and the semiconductor device mounted thereon can be obtained. The bonding is carried out by accurate soldering through CCB bond and so the semiconductor module is high in bonding reliability. Furthermore, when this semiconductor module is applied to a large-sized electronic computer, high density integration high in bonding reliability can be attained. Furthermore, when the ceramic laminated circuit substrate of the present invention which contains a capacitor is applied as a carrier substrate of semiconductor device to a large-sized electronic computer, the same effects as above can be obtained.

With reference to the method for making the ceramic laminated circuit substrate of the present invention, since the lengthwise direction of fibers contained in the green sheet is arranged in the casting direction of the green sheet, a substrate small in shrinkage in the plane direction at firing and less in fluctuation thereof can be easily produced by forming a laminate including fiber-containing composite green sheets different in the lengthwise direction of the fibers contained therein and firing the laminate.

The similar substrate can be easily produced by including in the laminate at least one fiber-containing composite green sheet made by coating a slurry on a glass cloth and firing the laminate.

Fiber-containing composite green sheet which can be used for ceramic laminated circuit substrate small in shrinkage in the plane direction at firing can be easily produced by uniformly coating a slurry according to the following methods: coating a slurry on a glass cloth; dipping a glass cloth in a slurry adjusted in its viscosity; passing a glass cloth coated with a slurry through a slit of doctor blade; and coating a slurry on both sides of a glass cloth.

Furthermore, when an alkoxide, water and a catalyst are mixed and the mixture is subjected to hydrolysis to obtain a liquid of suitable viscosity, this liquid is coated on a green sheet to form a fibrous gel, at least one of this green sheet and other green sheets are laminated and the laminate is fired, shrinkage of this green sheet in the lengthwise direction of the fibers at firing is small and hence ceramic laminated circuit substrate small in the plane direction can be easily produced.

What is claimed is:

1. A ceramic laminated circuit substrate comprising conductor layers and a plurality of ceramic insulating layers, said conductor layers being disposed between said ceramic insulating layers, wherein said ceramic insulating layers include at least two fiber-containing composite ceramic insulating layers and at least one fiber-free ceramic insulating layer, and wherein said fiber-containing ceramic insulating layers are placed at a distance from each other by means of said fiber-free ceramic insulating layer and in such a manner that the fibers in said composite ceramic insulating layers are oriented at least bidirectionally (x and y direction); said conductor layers, said composite ceramic insulating layers and said fiber-free ceramic insulating layer being integrally laminated by firing.

2. A ceramic laminated circuit substrate according to claim 1 wherein the fiber-containing composite ceramic insulating layers are laminated nearly symmetrically with respect to a centerplane of the thickness of the substrate or the lengthwise directions of the fibers in these layers cross each other.

3. A ceramic laminated circuit substrate according to claim 1 wherein a fiber-containing composite ceramic insulating layer which contains fibers crossing each other in the lengthwise direction thereof is laminated nearly at the center of the thickness of the substrate.

4. A ceramic laminated circuit substrate comprising conductor layers and a plurality of ceramic insulating layers, said conductor layers being disposed between ceramic insulating layers, wherein said ceramic insulating layers include at least one fiber-containing composite ceramic insulating layer and at least one fiber-free ceramic insulating layer and the circuit substrate has a void content of 10 vol% or less.

5. A ceramic laminated circuit substrate according to claim 1, wherein the conductor layer comprises Cu, Au, Ag, Ag-Pd, W, or an alloy of at least two of them and ceramic material of the ceramic insulating layers softens at a temperature lower than the melting point of the conductor layer.

6. A ceramic laminated circuit substrate according to claim 1, wherein softening point of the fibers is higher than softening point of a matrix of ceramic molded product before firing.

7. A ceramic laminated circuit substrate according to claim 1, which has at least one of a through-hole conductor and a via-hole conductor.

8. A ceramic laminated circuit substrate according to claim 1, on which a thin film multi-layer wiring is formed.

9. A ceramic laminated circuit substrate according to claim 1, which contains a capacitor or a resistor.

10. A semiconductor module which comprises a ceramic laminated circuit substrate according to claim 1, and a semiconductor device mounted on the substrate.

11. A semiconductor module according to claim 10, wherein the semiconductor device is mounted on the substrate through CCB bonding.

12. A ceramic laminated circuit substrate comprising a pre-fired substrate, at least one fiber-free ceramic insulating layer formed on said pre-fired ceramic substrate, and carrying a conductor layer; and a fiber-containing composite insulating layer formed on said fiber-free ceramic insulating layer; said conductor layer being disposed between said insulating layers.

13. A ceramic laminated circuit substrate comprising conductor layers and ceramic insulating layers, said conductor layers being disposed between said ceramic insulating layers, wherein said ceramic insulating layers include two fiber-containing composite ceramic insulating layers and three fiber-free ceramic insulating layers, said fiber-containing composite ceramic insulating layers and said fiber-free ceramic insulating layers being alternately laminated in such a manner that the fibers in said composite ceramic insulating layers are oriented at least bidirectionally (x and y direction); said conductor layers, said composite ceramic insulating layers and said fiber-free ceramic insulating layers being integrally laminated by firing.

* * * * *